(12) United States Patent
Kobayashi et al.

(10) Patent No.: US 9,502,465 B2
(45) Date of Patent: Nov. 22, 2016

(54) SOLID-STATE IMAGE PICKUP DEVICE

(71) Applicant: CANON KABUSHIKI KAISHA, Tokyo (JP)

(72) Inventors: Masahiro Kobayashi, Tokyo (JP); Yuichiro Yamashita, Ebina (JP); Yusuke Onuki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/693,692

(22) Filed: Apr. 22, 2015

(65) Prior Publication Data
US 2015/0228692 A1 Aug. 13, 2015

Related U.S. Application Data

(63) Continuation of application No. 13/500,043, filed as application No. PCT/JP2010/005841 on Sep. 29, 2010, now Pat. No. 9,041,132.

(30) Foreign Application Priority Data

Oct. 9, 2009 (JP) .................................. 2009-235088

(51) Int. Cl.
*H01L 31/101* (2006.01)
*H01L 27/148* (2006.01)
(Continued)

(52) U.S. Cl.
CPC ..... *H01L 27/14806* (2013.01); *H01L 27/1463* (2013.01); *H01L 27/14603* (2013.01); *H01L 27/14609* (2013.01); *H01L 27/14612* (2013.01); *H04N 5/335* (2013.01); *H04N 5/359* (2013.01); *H04N 5/37452* (2013.01)

(58) Field of Classification Search
CPC .......................................... H01L 25/167; H01L 27/14643–27/156; H01L 27/3227; H01L 31/02024; H01L 31/0203; H01L 31/1032; H01L 31/107
See application file for complete search history.

(56) References Cited

U.S. PATENT DOCUMENTS

2003/0209712 A1  11/2003  Fujita
2005/0035375 A1  2/2005  Hirata
(Continued)

FOREIGN PATENT DOCUMENTS

CN  1552100 A  12/2004
CN  1685516 A  10/2005
(Continued)

*Primary Examiner* — Cuong B Nguyen
(74) *Attorney, Agent, or Firm* — Canon USA, Inc. IP Division

(57) ABSTRACT

A solid-state image pickup device includes a plurality of pixels, each of the pixels including a photoelectric conversion portion, a charge holding portion, a floating diffusion, and a transfer portion. The pixel also includes a beneath-holding-portion isolation layer and a pixel isolation layer. An end portion on a photoelectric conversion portion side of the pixel isolation layer is away from the photoelectric conversion portion compared to an end portion on a photoelectric conversion portion side of the beneath-holding-portion isolation layer, and an N-type semiconductor region constituting part of the photoelectric conversion portion is disposed under at least part of the beneath-holding-portion isolation layer.

8 Claims, 11 Drawing Sheets

(51) Int. Cl.
*H01L 27/146* (2006.01)
*H04N 5/335* (2011.01)
*H04N 5/359* (2011.01)
*H04N 5/3745* (2011.01)

(56) References Cited

U.S. PATENT DOCUMENTS

| | | |
|---|---|---|
| 2006/0046338 A1 | 3/2006 | Patrick |
| 2007/0141772 A1 | 6/2007 | Nagano |
| 2007/0235827 A1 | 10/2007 | Altice |
| 2009/0256176 A1 | 10/2009 | Kobayashi |

FOREIGN PATENT DOCUMENTS

| | | |
|---|---|---|
| EP | 1732135 A2 | 12/2006 |
| EP | 2486590 B1 | 12/2013 |
| JP | 2003-258232A A | 9/2003 |
| JP | 2004-165462A A | 6/2004 |
| JP | 2006-197383 A | 7/2006 |
| JP | 2006-246450 A | 9/2006 |
| JP | 2008-004692 A | 1/2008 |
| JP | 2009-038167 A | 2/2009 |
| WO | 03/096421A A1 | 11/2003 |

SOLID-STATE IMAGE PICKUP DEVICE

CROSS-REFERENCE TO RELATED APPLICATION

This application is a Continuation of co-pending U.S. patent application Ser. No. 13/500,043 filed Apr. 3, 2012, which is a National Phase application of International Application No. PCT/JP2010/005841, filed Sep. 29, 2010. This application claims the benefit of Japanese Patent Application No. 2009-235088, filed Oct. 9, 2009, which is hereby incorporated by reference herein in its entirety.

TECHNICAL FIELD

The present invention relates to a solid-state image pickup device. More specifically, the present invention relates to a solid-state image pickup device in which each of pixels has a charge holding portion.

BACKGROUND ART

In recent years, a configuration in which each of pixels has a charge holding portion isolated from a photoelectric conversion portion and a floating diffusion (hereinafter FD) has been considered for higher performance of a solid-state image pickup device. Firstly, the charge holding portion is provided in each pixel for realizing a global electronic shutter, as described in PTL 1 and PTL 2. Secondly, the charge holding portion is provided in each pixel for expanding a dynamic range, as described in PTL 3. Thirdly, the charge holding portion is provided in each pixel for realizing a configuration having an analog-to-digital (AD) converter for each pixel, as described in PTL 4.

PTL 1 discloses a configuration in which a photoelectric conversion portion and a charge holding portion are disposed in a P-type well. PTL 2 discloses a configuration of reducing noise by suppressing inflow of charges generated at a deep position of a semiconductor region into a charge holding portion. Specifically, PTL 2 discloses a configuration including a P-type well having a photoelectric conversion portion therein, a charge holding portion, and a P-type layer that is provided under at least part of the charge holding portion via part of the P-type well and that has a higher impurity concentration than the P-type well.

CITATION LIST

Patent Literature

[PTL 1]
Japanese Patent Laid-Open No. 2006-246450
[PTL 2]
Japanese Patent Laid-Open No. 2008-004692
[PTL 3]
Japanese Patent Laid-Open No. 2006-197383
[PTL 4]
Japanese Patent Laid-Open No. 2009-038167

SUMMARY OF INVENTION

Technical Problem

The inventor has found that, in the configuration disclosed in PTL 1, there is a point to be improved, that is, charges generated in the P-type well may flow into the charge holding portion. It is desired that inflow of charges except signal charges does not occur during a period when the charge holding portion holds signal charges. The charges flowing into the charge holding portion cause noise.

In the configuration disclosed in PTL 2, charges generated in the P-type well flow into the photoelectric conversion portion of an adjacent pixel. The charges flowing into the adjacent pixel cause color mixture, which leads to degradation of image quality.

In view of the above-described problems, an embodiment of the present invention is directed to suppressing inflow of charges into a charge holding portion and reducing color mixture among pixels.

Solution to Problem

A solid-state image pickup device according to an aspect of the present invention includes a plurality of pixels. Each of the plurality of pixels includes a photoelectric conversion portion configured to generate charges in accordance with incident light, a charge holding portion configured to include a first-conductivity-type first semiconductor region that holds the charges generated by the photoelectric conversion portion in a portion different from the photoelectric conversion portion, a floating diffusion, and a transfer portion configured to include a transfer gate electrode that controls a potential between the first semiconductor region and the floating diffusion. A second-conductivity-type second semiconductor region is disposed under at least part of the first semiconductor region. A second-conductivity-type third semiconductor region is disposed at a deeper position than the second semiconductor region, the third semiconductor region extending under the transfer gate electrode, the floating diffusion, and at least part of the first semiconductor region. An end portion on a photoelectric conversion portion side of the third semiconductor region is away from the photoelectric conversion portion compared to an end portion on a photoelectric conversion portion side of the second semiconductor region. A first-conductivity-type semiconductor region constituting part of the photoelectric conversion portion is disposed in a region which is under at least part of the second semiconductor region and in which the third semiconductor region is not disposed.

Advantageous Effects of Invention

In the solid-state image pickup device according to an embodiment of the present invention, inflow of charges into a charge holding portion can be suppressed, and inflow of charges into an adjacent pixel can be suppressed.

Further features of the present invention will become apparent from the following description of exemplary embodiments with reference to the attached drawings.

DESCRIPTION OF EMBODIMENTS

Hereinafter, embodiments of the present invention will be described in detail with reference to the attached drawings. In each of the embodiments, electrons are used as signal charges. However, holes may be used as signal charges. In a case where electrons are used as signal charges, a first-conductivity-type is N-type, and a second-conductivity-type is P-type. In a case where holes are used as signal charges, the conductivity type of each semiconductor region may be reversed with respect to the case where electrons are used as signal charges. The schematic cross-sectional view in each embodiment illustrates only one pixel, but actually a plurality of pixels are arranged in a matrix, for example.

First Embodiment

Figure 1A:
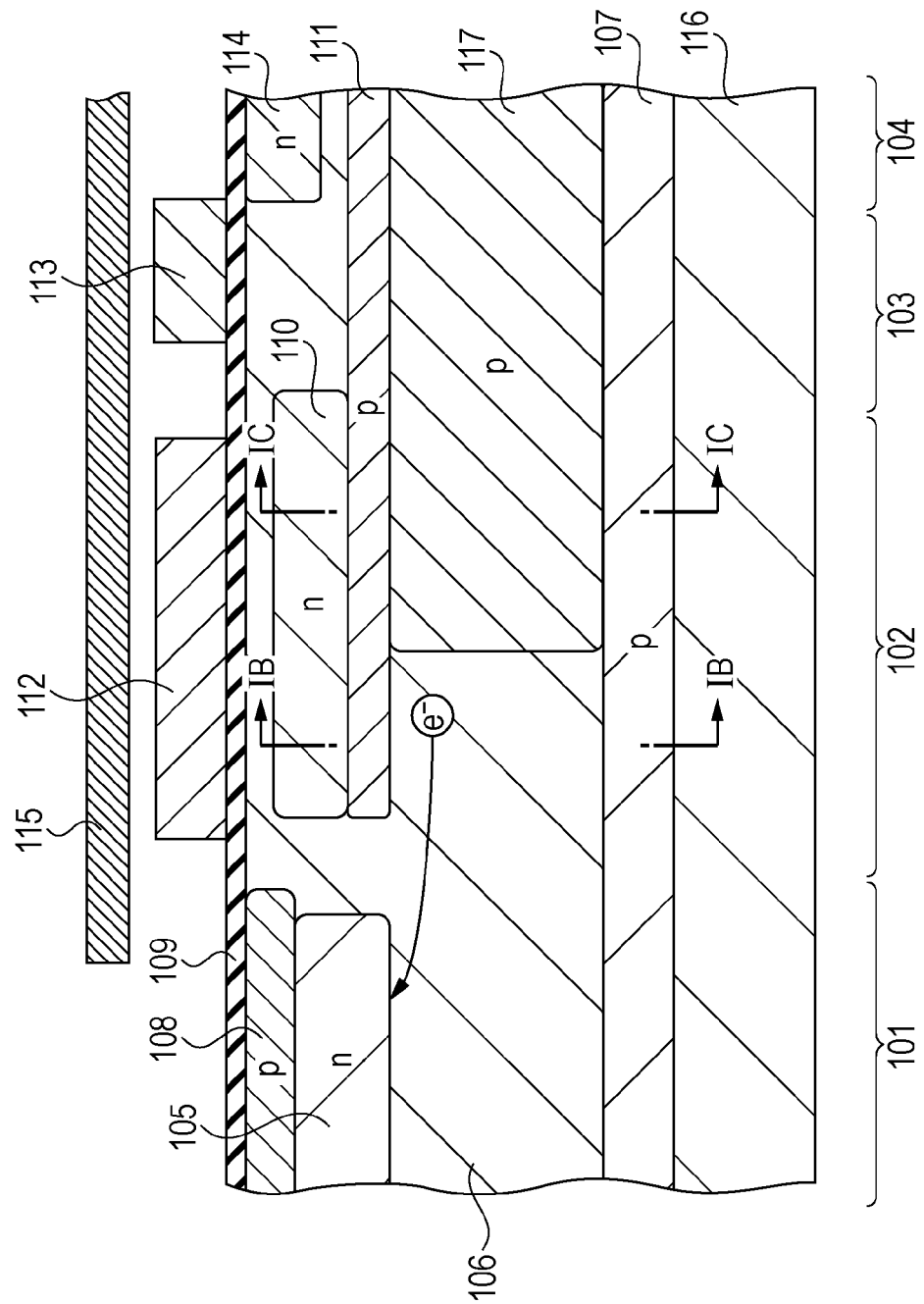
FIG. 1A is a schematic view of a cross section of a pixel of a solid-state image pickup device according to a first embodiment of the present invention.

FIG. 1A is a schematic view of a cross section of a pixel of a solid-state image pickup device according to an embodiment of the present invention. Reference numeral 101 denotes a photoelectric conversion portion. A photodiode configured to include a P-type semiconductor region and an N-type semiconductor region is used, for example. Reference numeral 102 denotes a charge holding portion. The charge holding portion 102 is configured to include an N-type semiconductor region capable of holding charges generated by the photoelectric conversion portion 101. Reference numeral 103 denotes a transfer portion. The transfer portion 103 transfers charges held by the charge holding portion 102 to a sense node. Reference numeral 104 denotes the sense node. The sense node 104 is configured to include a floating diffusion (FD) that is electrically connected to the gate of a pixel amplification metal oxide semiconductor (MOS) transistor, for example. The FD may be electrically connected to a vertical signal line (not illustrated), instead of being electrically connected to the gate of the pixel amplification MOS transistor.

Next, specific configurations of the foregoing individual members will be described. In this embodiment, the photoelectric conversion portion 101, the charge holding portion 102, the transfer portion 103, and the sense node 104 are arranged on one of principal surfaces of an N-type substrate 116.

In this embodiment, a pixel structure is disposed on a surface of the N-type substrate 116 that is formed through epitaxial growth. Alternatively, the pixel structure may be disposed on a surface of a P-type substrate or a P-type well. An advantage of disposing the pixel structure on the N-type substrate 116 formed through epitaxial growth is that, since a P-type buried layer serves as a potential barrier, charges generated by the photoelectric conversion portion 101 are unlikely to be discharged to the substrate. Thus, it is preferable for increasing the sensitivity that a pixel structure is disposed on the N-type substrate 116 that is formed through epitaxial growth.

In a configuration where the impurity concentration of the N-type semiconductor region in the photoelectric conversion portion 101 is low and where generated charges are immediately transferred to the charge holding portion 102 without being accumulated in the photoelectric conversion portion 101, the effect of increasing the sensitivity using the N-type substrate 116 becomes particularly significant.

Reference numerals 105 and 106 denote N-type semiconductor regions. The N-type semiconductor region 105 is disposed in the N-type semiconductor region 106 and has an N-type impurity concentration higher than that of the N-type semiconductor region 106. The N-type semiconductor region 105 forms a PN junction together with a P-type semiconductor region 108. The N-type semiconductor region 106 forms a PN junction together with a P-type buried layer 107, which is disposed under the N-type semiconductor region 106.

The P-type semiconductor region 108 is a high-concentration P-type semiconductor region. Providing the P-type semiconductor region 108 enables reduction of a dark current that is generated on a surface of semiconductor. In this embodiment, the foregoing photoelectric conversion portion 101 is constituted by the N-type semiconductor regions 105 and 106, the P-type buried layer 107, and the P-type semiconductor region 108.

Reference numeral 110 denotes an N-type semiconductor region. In this embodiment, the N-type semiconductor region 110 functions as a first semiconductor region that holds charges in a portion different from the photoelectric conversion portion 101. Reference numeral 112 denotes a control electrode. The foregoing charge holding portion 102 is configured to include the N-type semiconductor region 110 and the control electrode 112.

The charge holding portion 102 according to this embodiment includes the control electrode 112, which is disposed above the N-type semiconductor region 110 via an insulating film 109. The control electrode 112 controls the potential on a semiconductor surface side of the N-type semiconductor region 110. A negative voltage may be applied to the control electrode 112 so as to suppress an influence of a dark current generated in the charge holding portion 102.

The control electrode 112 may also have a function of controlling a potential between the photoelectric conversion portion 101 and the charge holding portion 102. Alternatively, a distinct electrode from the control electrode 112 may be disposed for controlling the potential between the photoelectric conversion portion 101 and the charge holding portion 102.

An embodiment of the present invention can be applied to a configuration that does not include the control electrode 112. For example, the N-type semiconductor region 110 may be selectively connected to the power source via a contact plug and a switch.

Reference numeral 113 denotes a transfer gate electrode. A voltage supplied to the transfer gate electrode 113 forms a transfer path of the charge holding portion 102 in a region adjacent to the N-type semiconductor region 110. In this embodiment, a pixel structure is formed on the N-type substrate 116, and thus the conductivity type of the transfer path is N-type. P-type channel doping may be performed in the region provided with the transfer path. The transfer gate electrode 113 is disposed so that the transfer path is formed at a position where signal charges can be transferred from the charge holding portion 102 to the sense node 104 described below. The transfer gate electrode 113 switches between a state where the transfer path is formed and a state where the transfer path is not formed in accordance with a voltage supplied thereto, so as to control the electrical connection between the charge holding portion 102 and the sense node 104.

An FD 114 is an N-type semiconductor region. In this embodiment, the FD 114 functions as a sense node. The sense node may be a semiconductor region from which a signal is output in accordance with the amount of charges accumulated therein.

Reference numeral 115 denotes a light shielding member. The light shielding member 115 reduces incident light to the charge holding portion 102, the transfer portion 103, and the sense node 104, or completely blocks incident light thereto.

Reference numeral 111 denotes a P-type semiconductor region. The P-type semiconductor region 111 is disposed under the N-type semiconductor region 110 and forms a potential for reducing inflow of charges from a deep portion of the substrate to the N-type semiconductor region 110. Hereinafter, the P-type semiconductor region 111 is referred to as a beneath-holding-portion isolation layer for convenience. In this embodiment, the beneath-holding-portion isolation layer 111 extends in the charge holding portion 102, the transfer portion 103, and the FD. The configuration is not limited thereto, and the beneath-holding-portion isolation layer 111 may be disposed under at least part of the N-type semiconductor region 110. In this embodiment, the beneath-holding-portion isolation layer 111 corresponds to the second semiconductor region described in the claims.

Furthermore, a P-type semiconductor region 117 functioning as a pixel isolation layer is disposed under the beneath-holding-portion isolation layer 111. The upper end of the pixel isolation layer 117 is disposed such that the pixel isolation layer 117 and the beneath-holding-portion isolation layer 111 are in electrical conduction. The lower end of the pixel isolation layer 117 is at the depth where the PN junction interface between the N-type semiconductor region 106 constituting part of the photoelectric conversion portion 101 and the P-type buried layer 107 is disposed. The pixel isolation layer 117 functions as a potential barrier for signal charges generated in the N-type semiconductor region 106, thereby suppressing inflow of generated signal charges into an adjacent pixel.

The end portion in the horizontal direction with respect to the substrate surface of the pixel isolation layer 117 is offset from the photoelectric conversion portion side in the same pixel, with the end portion on the photoelectric conversion portion side of the beneath-holding-portion isolation layer 111 being a reference. The N-type semiconductor region 106 constituting part of the photoelectric conversion portion 101 is disposed in the portion where the pixel isolation layer 117 is not disposed due to its offset end portion. Thus, the N-type semiconductor region 106 constituting the photoelectric conversion portion 101 is disposed under at least part of the N-type semiconductor region 110, with the beneath-holding-portion isolation layer 111 therebetween. Accordingly, the beneath-holding-portion isolation layer 111 forms a potential barrier with respect to signal charges, so that inflow of signal charges generated in a deep portion of the charge holding portion 102 into the N-type semiconductor region 110 can be suppressed. In this embodiment, the pixel isolation layer 117 corresponds to the third semiconductor region described in the claims.

Figure 1B:
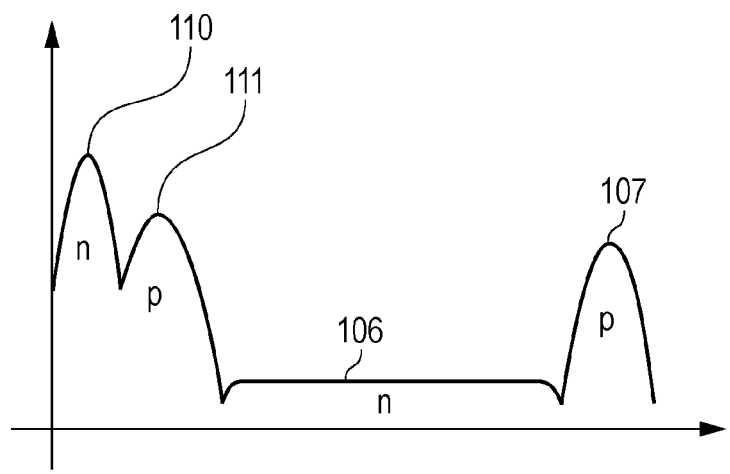
FIG. 1B illustrates an impurity profile along a depth direction in the IB-IB cross section in FIG. 1A.
Figure 1C:
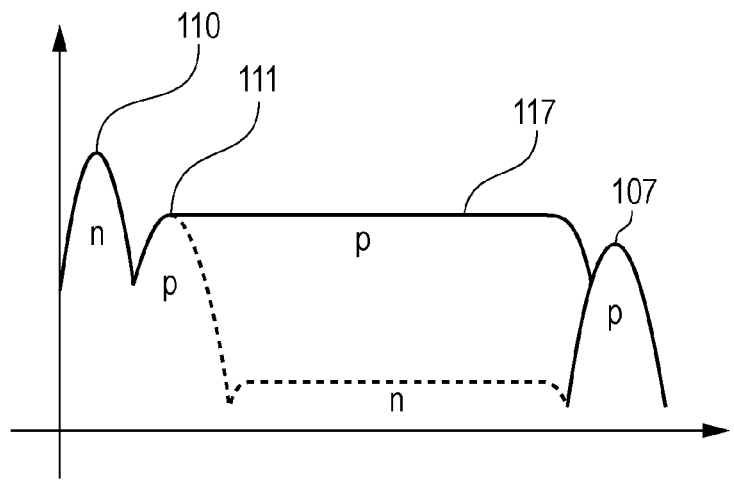
FIG. 1C illustrates an impurity profile along a depth direction in the IC-IC cross section in FIG. 1A.

FIGS. 1B and 1C illustrate impurity concentration distributions along a depth direction in the IB-IB cross section and the IC-IC cross section illustrated in FIG. 1A, respectively. Among those cross sections, the IB-IB cross section is a cross section of a portion close to the photoelectric conversion portion 101 of the N-type semiconductor region 110, and the IC-IC cross section is a cross section of a portion far from the photoelectric conversion portion 101 of the N-type semiconductor region 110.

In the IB-IB cross section, the impurity concentration peak of the N-type semiconductor region 110 is formed at the shallowest position with respect to the surface of the semiconductor substrate. The impurity concentration peak of the beneath-holding-portion isolation layer 111 exists under the impurity concentration peak of the N-type semiconductor region 110. Furthermore, the N-type semiconductor region 106 is disposed under the beneath-holding-portion isolation layer 111. On the other hand, in the IC-IC cross section, the impurity concentration peak of the N-type semiconductor region 110 is formed at the shallowest position, and the beneath-holding-portion isolation layer 111 and the pixel isolation layer 117 are disposed thereunder with a uniform impurity concentration distribution. That is, FIGS. 1B and 1C illustrate that the end portion on the photoelectric conversion portion side of the pixel isolation layer 117 is offset toward the FD side, with the end portion on the photoelectric conversion portion side of the N-type semiconductor region 110 being a reference. Also, FIGS. 1B and 1C illustrate that the N-type semiconductor region 106 constituting the photoelectric conversion portion 101 is disposed under at least part of the N-type semiconductor region 110 via the beneath-holding-portion isolation layer 111.

As illustrated in FIG. 1C, the lower end of the pixel isolation layer 117 is at the depth where the PN junction interface between the N-type semiconductor region 106 and the P-type buried layer 107 is disposed.

Figure 2:
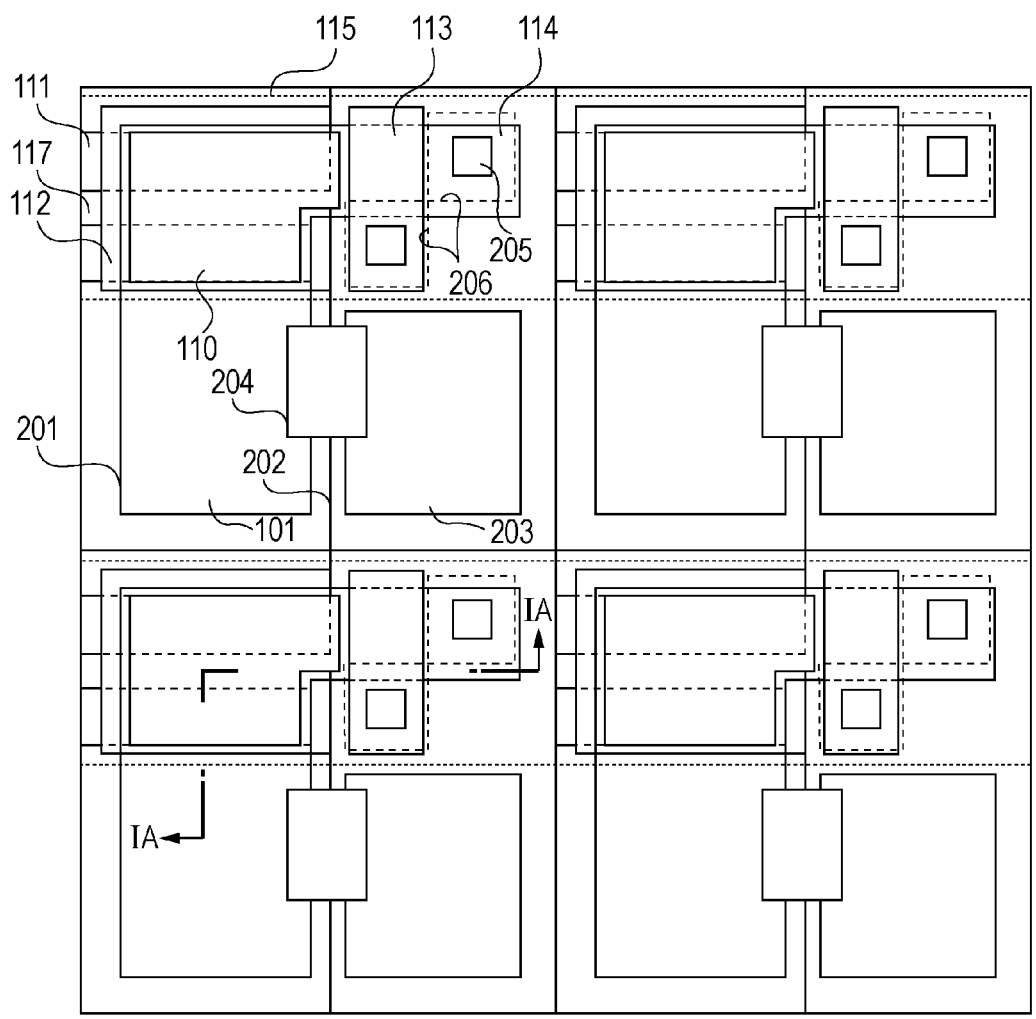
FIG. 2 is a top view of pixels of the solid-state image pickup device according to the first embodiment of the present invention.

FIG. 2 is a top view of a pixel region according to this embodiment. FIG. 2 illustrates four pixels, but more pixels may be provided. A schematic view of the IA-IA cross section in FIG. 2 is illustrated in FIG. 1A. The parts having the same function as in FIG. 1A are denoted by the same reference numerals, and a detailed description thereof will be omitted.

Reference numeral 201 denotes an active region. In the active region 201, the photoelectric conversion portion 101, the N-type semiconductor region 110, the beneath-holding-portion isolation layer 111, the transfer path, and the FD 114 are disposed. Reference numeral 202 denotes an element isolation region. A field oxide film is used for isolation of elements, for example. Alternatively, diffusion isolation using PN junction may be used. Reference numeral 203 denotes an in-pixel functional element region. In the in-pixel functional element region 203, functional elements such as a pixel amplification MOS transistor and a reset MOS transistor are disposed. Reference numeral 204 denotes a charge discharging gate electrode that is provided if necessary. By controlling the voltage applied to the charge discharging gate electrode 204, unnecessary charges are discharged to an overflow drain (hereinafter OFD) that is disposed in the in-pixel functional element region 203. Reference numeral 205 denotes a contact plug connected to the FD, and an opening 206 through which the contact plug 205 is disposed is provided in the light shielding member 115.

Figure 3A:
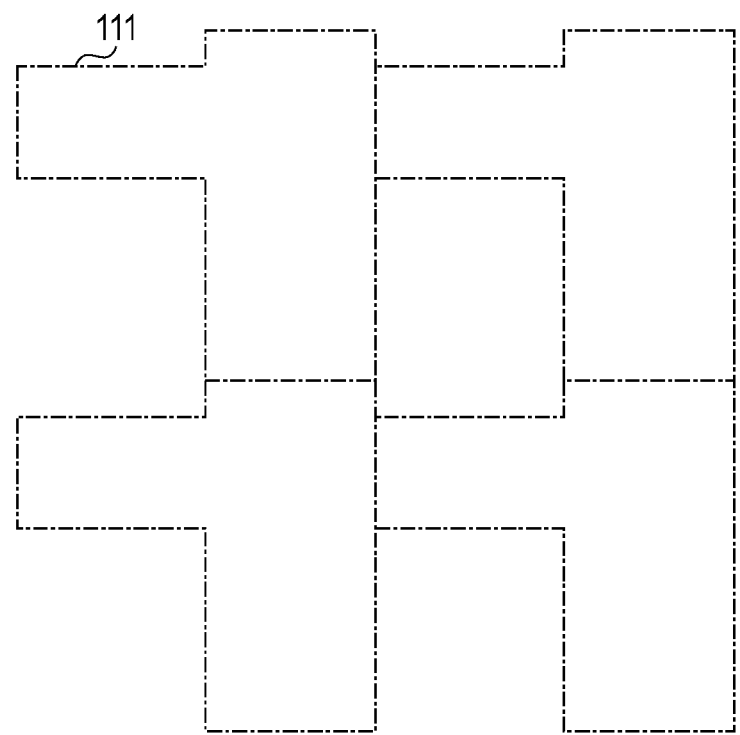
FIG. 3A is a top view of a partial configuration of pixels of the solid-state image pickup device according to the first embodiment of the present invention.

In this embodiment, the beneath-holding-portion isolation layer 111 is disposed over the entire region of the N-type semiconductor region 110 and the element isolation region 202. FIG. 3A illustrates a top view of a pixel region, illustrating only the beneath-holding-portion isolation layer 111. In FIG. 3A, the beneath-holding-portion isolation layer 111 is indicated by a chain line.

Figure 3B:
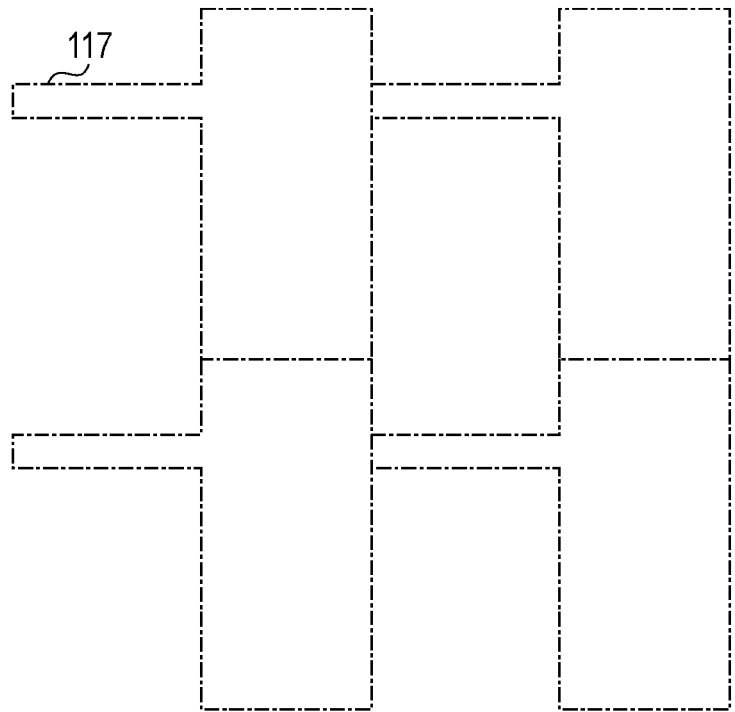
FIG. 3B is a top view of a partial configuration of pixels of the solid-state image pickup device according to the first embodiment of the present invention.

The pixel isolation layer 117 is disposed under the beneath-holding-portion isolation layer 111. The end portion on the photoelectric conversion portion side of the pixel isolation layer 117 is offset with respect to the end portion on the photoelectric conversion portion side of the N-type semiconductor region 110. FIG. 3B illustrates a top view of a pixel region, illustrating only the pixel isolation layer 117. In FIG. 3B, the pixel isolation layer 117 is indicated by a chain line. When a charge transfer direction from the photoelectric conversion portion 101 to the charge holding portion 102 is regarded as a width direction, under the N-type semiconductor region 110, the width of the pixel isolation layer 117 is smaller than the width of the beneath-holding-portion isolation layer 111. That is, the pixel isolation layer 117 is offset from both the photoelectric conversion portion 101 of the pixel and the photoelectric conversion portion 101 of the adjacent pixel.

The solid-state image pickup device according to this embodiment has a pixel structure in which a photoelectric conversion portion, a charge holding portion, and an FD are arranged in an L shape. Thus, when viewed in a vertical direction of FIG. 2, the charge holding portion is disposed between the photoelectric conversion portion of the pixel and the photoelectric conversion portion of the adjacent pixel. FIG. 1A illustrates a cross section in which the end portion of the pixel isolation layer 117 is offset with respect to the photoelectric conversion portion 101 of the pixel. Furthermore, as illustrated in FIG. 2, the end portion of the pixel isolation layer 117 may be offset with respect to the photoelectric conversion portion 101 of the adjacent pixel as well. Although not illustrated, the end portion of the pixel isolation layer 117 may not be offset with respect to the photoelectric conversion portion 101 of the pixel, and may be offset with respect to the photoelectric conversion portion 101 of the adjacent pixel. The end portion of the pixel isolation layer 117 may be offset with respect to at least one of photoelectric conversion portions adjacent to the charge holding portion of the pixel.

As described above, according to this embodiment, the pixel isolation layer 117 under the beneath-holding-portion isolation layer 111 is offset from the photoelectric conversion portion 101, and the N-type semiconductor region 106 is disposed in the offset region. Accordingly, the beneath-holding-portion isolation layer 111 serves as a potential barrier with respect to signal charges, so that inflow of charges generated in a lower portion of the charge holding portion 102 into the N-type semiconductor region 110 can be suppressed. Also, the pixel isolation layer 117 suppresses inflow of charges into a different pixel. The N-type semiconductor region 106 that is disposed in the region where the pixel isolation layer 117 is offset in a lower portion of the holding portion is part of the photoelectric conversion portion 101, and thus more charges are collected in the photoelectric conversion portion 101.

Second Embodiment

Figure 4A:
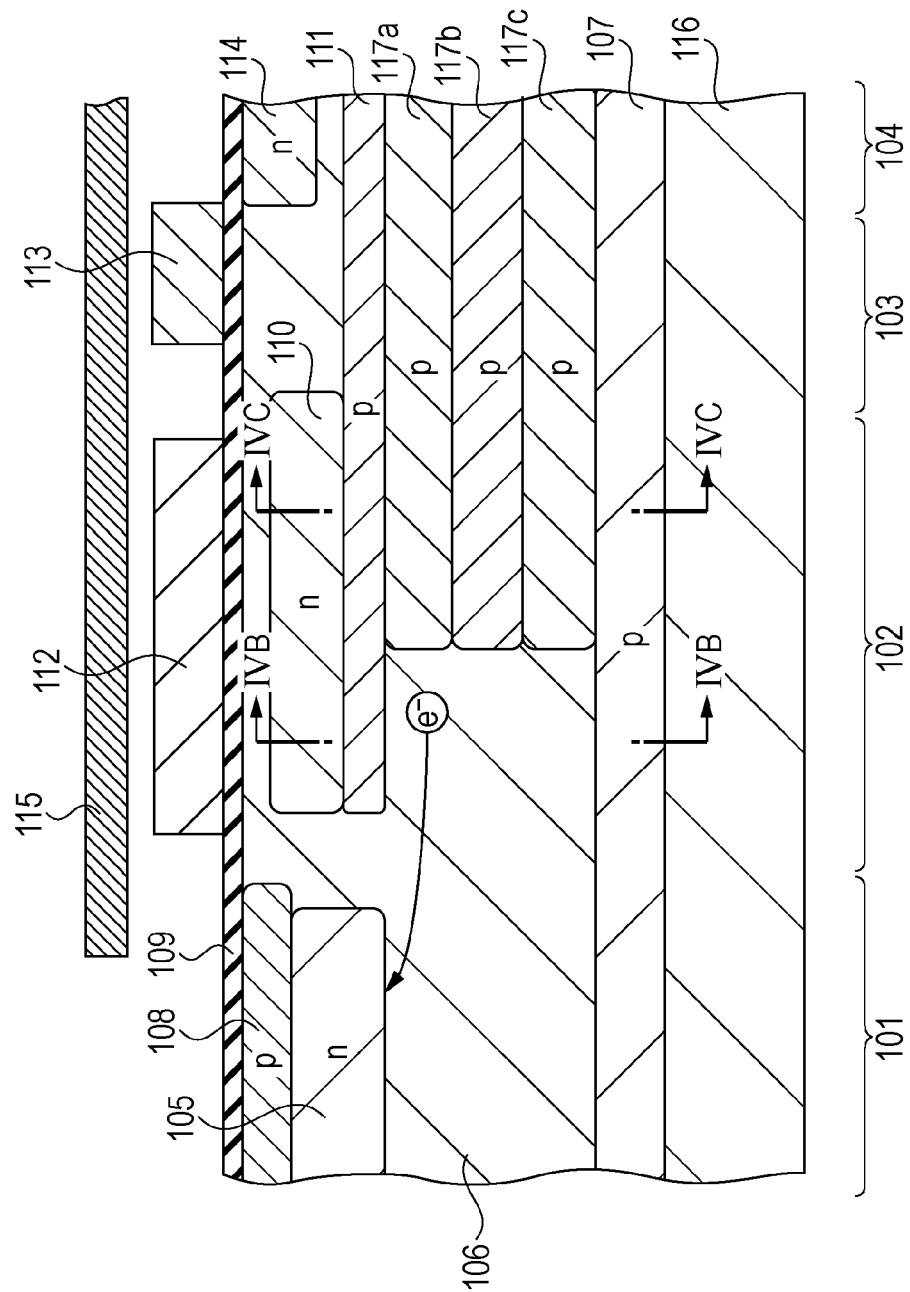
FIG. 4A is a schematic view of a cross section of a pixel of a solid-state image pickup device according to a second embodiment of the present invention.

FIG. 4A is a schematic view of a cross section of a pixel of a solid-state image pickup device according to a second embodiment of the present invention. The parts having the same function as those in the first embodiment are denoted by the same reference numerals, and a detailed description thereof will be omitted.

A difference between this embodiment and the first embodiment is that the pixel isolation layer is constituted by P-type semiconductor regions 117a, 117b, and 117c that are disposed at different depths. In this embodiment, the pixel isolation layer is constituted by the three semiconductor regions. However, the number of semiconductor regions is not limited to three, and the pixel isolation layer may be constituted by a plurality of semiconductor regions at different depths. The individual semiconductor regions may be formed through ion implantation steps using different acceleration energies.

Figure 4B:
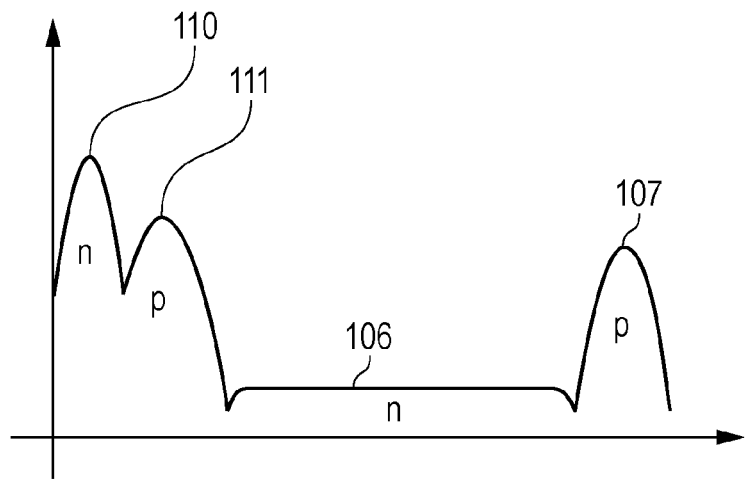
FIG. 4B illustrates an impurity profile along a depth direction in the IVB-IVB cross section in FIG. 4A.
Figure 4C:
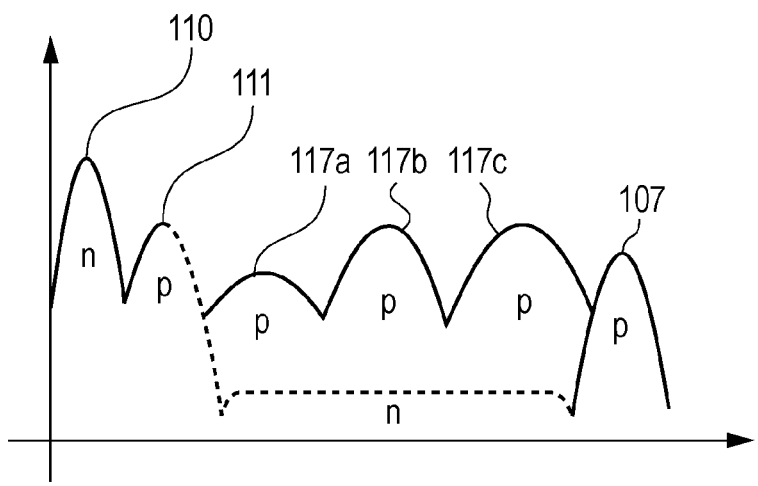
FIG. 4C illustrates an impurity profile along a depth direction in the IVC-IVC cross section in FIG. 4A.

FIGS. 4B and 4C illustrate impurity concentration distributions along a depth direction in the IVB-IVB cross section and the IVC-IVC cross section illustrate in FIG. 4A, respectively. As illustrated in FIG. 4B, the N-type semiconductor region 106 is disposed under at least part of the N-type semiconductor region 110 via the beneath-holding-portion isolation layer 111.

In FIG. 4C, the impurity concentration peak of the N-type semiconductor region 110 is at a position that is the closest to the surface. The impurity concentration peak of the beneath-holding-portion isolation layer 111 is at a position that is the second closest to the surface. As illustrated in FIG. 4C, the impurity distribution is nonuniform under the impurity concentration peak of the beneath-holding-portion isolation layer 111. Instead, the impurity concentration peaks of the three P-type semiconductor regions 117a, 117b, and 117c can be seen. The impurity concentration peak of the P-type buried layer 107 is at the deepest position.

In order to increase the sensitivity, it is appropriate that the P-type buried layer 107 is disposed at as deep position as possible with respect to the surface of the substrate provided with pixels. Accordingly, charges generated in a deep portion of the substrate are not discharged to the substrate side, and are easily collected as signal charges in the photoelectric conversion portion 101. However, in a case where the P-type buried layer 107 is disposed at a deep position of the substrate, it is difficult to constitute the pixel isolation layer by a single layer of semiconductor region. In contrast, by constituting the pixel isolation layer by a plurality of semiconductor regions disposed at different depths, the pixel isolation layer can be formed at a deeper position.

In this embodiment, the impurity concentration of the beneath-holding-portion isolation layer 111 is higher than the impurity concentration of the P-type semiconductor region 117a, which is the closest to the substrate surface among the P-type semiconductor regions 117a to 117c. As illustrated in FIG. 4C, the impurity concentration peak of the beneath-holding-portion isolation layer 111 is higher than the impurity concentration peak of the P-type semiconductor region 117a. With this configuration, a potential gradient is formed from the beneath-holding-portion isolation layer 111 to the pixel isolation layer. Accordingly, inflow of charges generated in the pixel isolation layer into the N-type semiconductor region 110 is reduced.

In this embodiment, the pixel isolation layer is constituted by a plurality of semiconductor regions having different impurity concentrations. Alternatively, the plurality of semiconductor regions may have impurity concentrations equal to each other. Furthermore, the impurity concentrations of the plurality of semiconductor regions constituting the pixel isolation layer may be equal to the impurity concentration of the beneath-holding-portion isolation layer 111.

As described above, in this embodiment, the pixel isolation layer is constituted by a plurality of semiconductor regions that are disposed at different depths. Accordingly, the pixel isolation layer can be easily disposed at a deep position. Therefore, according to this embodiment, it is possible to further increase the sensitivity and suppress inflow of charges into an adjacent pixel, in addition to obtain the effect in the first embodiment.

Also, in this embodiment, the impurity concentration of the beneath-holding-portion isolation layer 111 is higher than the impurity concentration of the P-type semiconductor region 117a which is the closest to the substrate surface among the P-type semiconductor regions 117a to 117c. Accordingly, inflow of charges generated in the pixel isolation layer into the N-type semiconductor region 110 is reduced. As described above, according to this embodiment, it is possible to further suppress inflow of charges into the charge holding portion 102, in addition to obtain the effect in the first embodiment.

Third Embodiment

Figure 5:
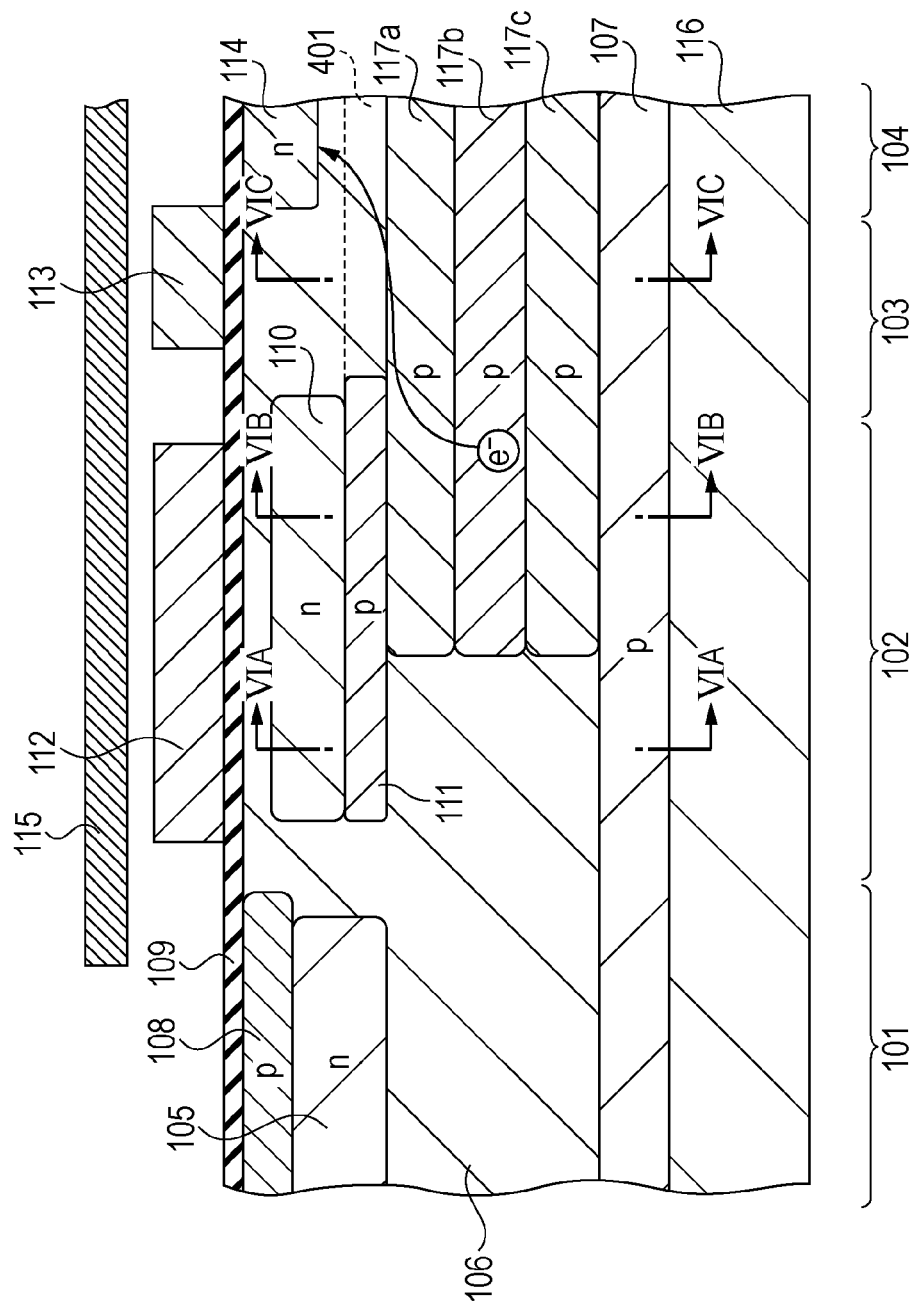
FIG. 5 is a schematic view of a cross section of a pixel of a solid-state image pickup device according to a third embodiment of the present invention.

FIG. 5 is a schematic view of a cross section of a pixel of a solid-state image pickup device according to a third embodiment of the present invention. The parts having the same function as those in the first and second embodiments are denoted by the same reference numerals, and a detailed description thereof will be omitted.

A difference between this embodiment and the first and second embodiments is that, as illustrated in FIG. 5, at the depth where the impurity concentration peak of the beneath-holding-portion isolation layer 111 exists, the impurity concentration of the beneath-holding-portion isolation layer 111 is higher than the impurity concentration of the region under the FD 114 at the same depth. In other words, under at least part of the FD 114, the beneath-holding-portion isolation layer 111, which is a high-concentration P-type semiconductor region, does not exist, or the impurity concentration thereof is low.

Figure 6A:
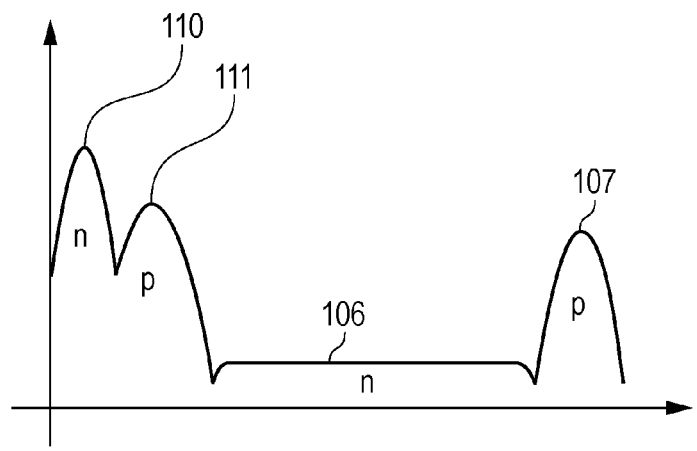
FIG. 6A illustrates an impurity profile along a depth direction in the VIA-VIA cross section in FIG. 5.
Figure 6B:
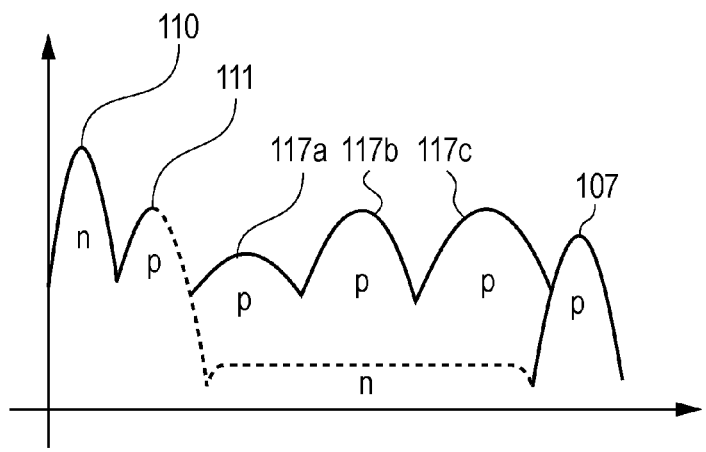
FIG. 6B illustrates an impurity profile along a depth direction in the VIB-VIB cross section in FIG. 5.
Figure 6C:
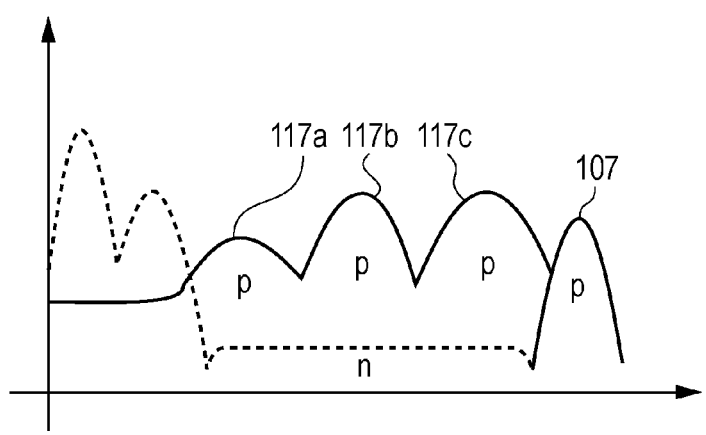
FIG. 6C illustrates an impurity profile along a depth direction in the VIC-VIC cross section in FIG. 5.

FIGS. 6A, 6B, and 6C illustrate impurity concentration distributions along a depth direction in the VIA-VIA cross section, the VIB-VIB cross section, and the VIC-VIC cross section illustrate in FIG. 5, respectively. The impurity concentration distributions in the VIA-VIA cross section and the VIB-VIB cross section are the same as those in the second embodiment.

In the VIC-VIC cross section, which is a cross section in the transfer portion 103, the impurity concentration at the same depth as the impurity concentration peak of the beneath-holding-portion isolation layer 111 is lower than the impurity concentration of the beneath-holding-portion isolation layer 111. In the VIC-VIC cross section, the N-type semiconductor region 110 does not extend. In this embodiment, the beneath-holding-portion isolation layer 111 does not exist in the transfer portion 103 where the N-type semiconductor region 110 does not exist, neither under the FD 114.

Figure 7:
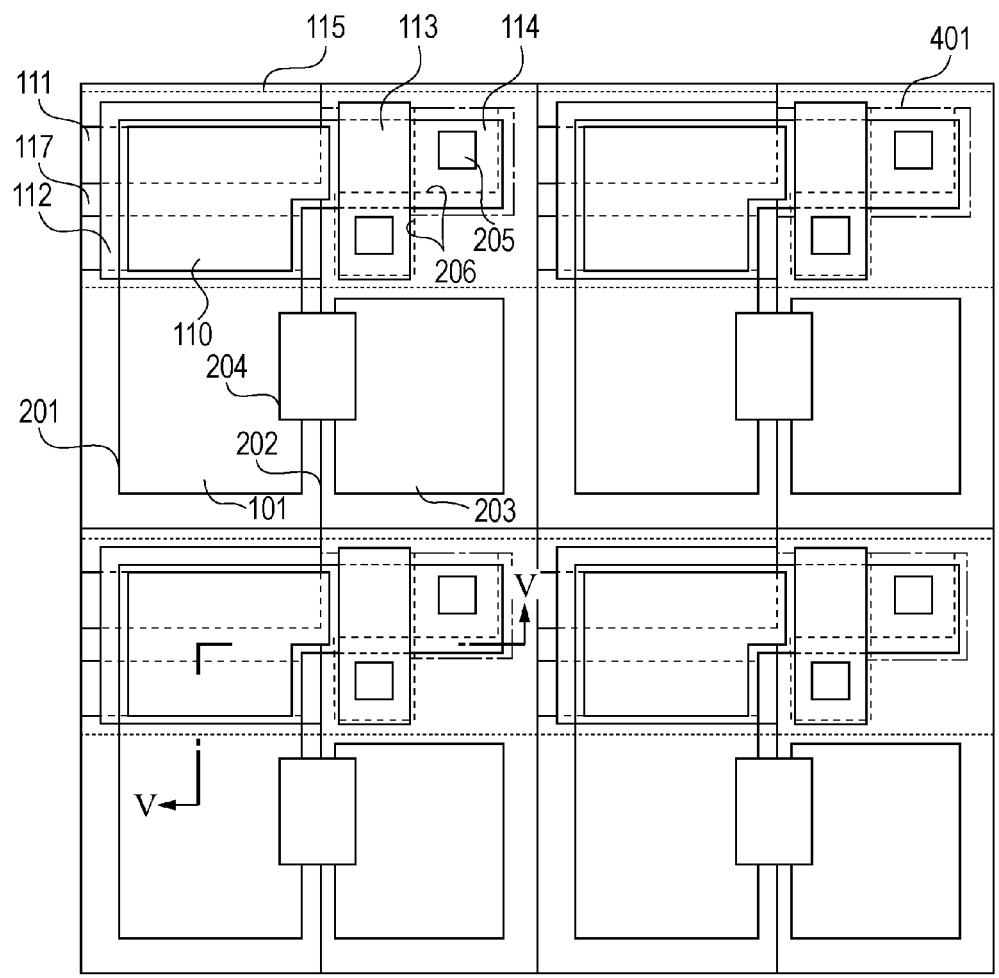
FIG. 7 is a top view of pixels of the solid-state image pickup device according to the third embodiment of the present invention.

FIG. 7 is a top view of a pixel region according to this embodiment. FIG. 7 illustrates only four pixels, but the solid-state image pickup device according to this embodiment may include more pixels. A schematic view of the V-V cross section in FIG. 7 is illustrated in FIG. 5. The parts having the same function as in FIG. 5 are denoted by the same reference numerals, and a detailed description thereof will be omitted. In this embodiment, a region 401 indicated by a chain line in FIG. 7 represents a region where the beneath-holding-portion isolation layer 111 does not exist.

Figure 8A:
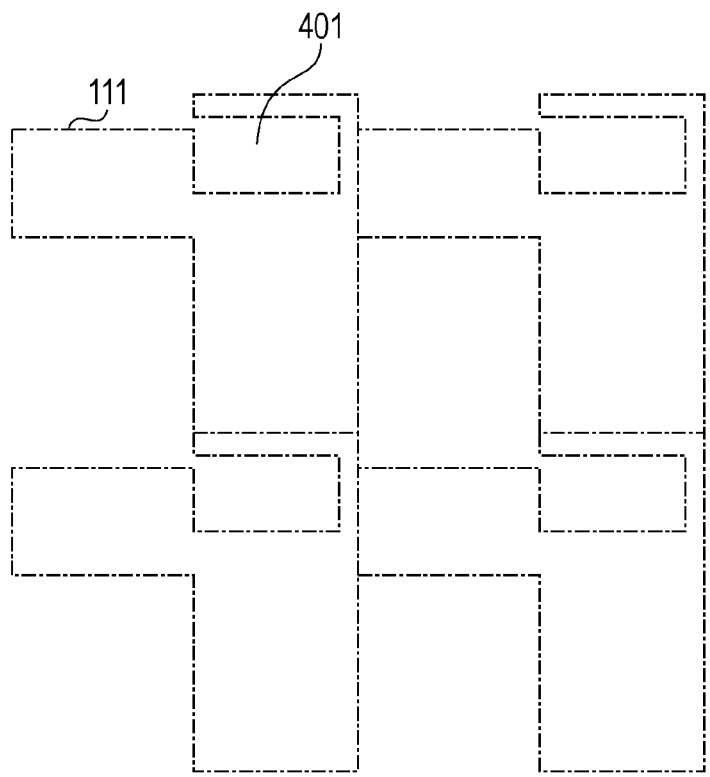
FIG. 8A is a top view of a partial configuration of pixels of the solid-state image pickup device according to the third embodiment of the present invention.

FIG. 8A is a top view illustrating only the beneath-holding-portion isolation layer 111. In this embodiment, the beneath-holding-portion isolation layer 111 is disposed over the entire N-type semiconductor region 110. However, the beneath-holding-portion isolation layer 111 does not exist in the transfer portion 103 and under the FD 114. In FIG. 8A, the region 401 indicated by a chain line represents a region where the beneath-holding-portion isolation layer 111 does not exist.

Figure 8B:
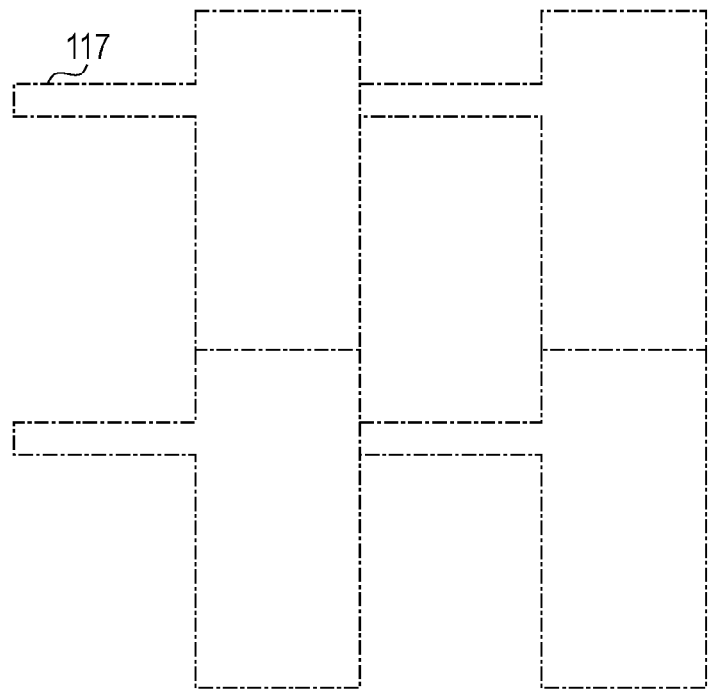
FIG. 8B is a top view of a partial configuration of pixels of the solid-state image pickup device according to the third embodiment of the present invention.

FIG. 8B is a top view illustrating only the pixel isolation layer 117. The planar shape of the pixel isolation layer 117 is the same as that in the first embodiment or the second embodiment.

According to the above-described configuration of this embodiment, the beneath-holding-portion isolation layer 111 does not exist in the transfer portion 103 and under the FD 114. Accordingly, charges generated in the pixel isolation layer 117 do not flow into the N-type semiconductor region 110 or the photoelectric conversion portion 101 of an adjacent pixel, and the possibility that the charges are discharged to the FD 114 becomes high. The FD 114 is reset before signal charges are transferred, and thus the charges discharged to the FD 114 do not cause noise. As described above, according to this embodiment, it is possible to further suppress inflow of charges into the charge holding portion 102 and an adjacent pixel, in addition to obtain the effects in the first and second embodiments.

[Application of Solid-State Image Pickup Device]

Figure 9:
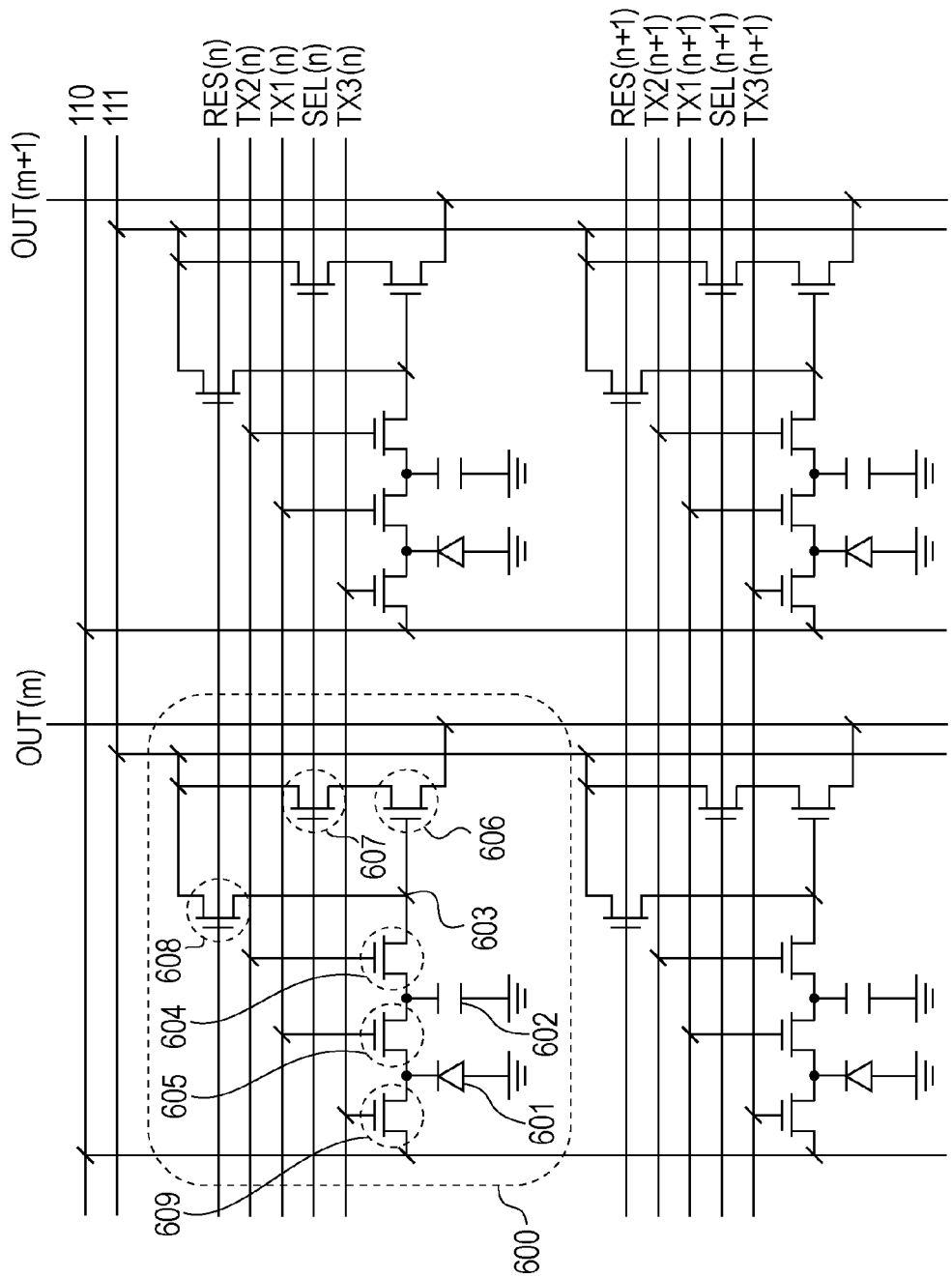
FIG. 9 is an equivalent circuit diagram of pixels of a solid-state image pickup device according to an embodiment of the present invention.

FIG. 9 is an equivalent circuit diagram of a solid-state image pickup device that can be applied to all the foregoing embodiments. The solid-state image pickup device having this equivalent circuit can perform a global electronic shutter operation.

Reference numeral 601 denotes a photoelectric conversion portion. A photodiode is used here. Reference numeral 602 denotes a charge holding portion, which holds signal charges generated by the photoelectric conversion portion 601. Reference numeral 603 denotes a sense node of an amplifying portion. For example, an FD and a gate electrode of an amplifying transistor that is electrically connected to the FD correspond to the sense node 603. Reference numeral 604 denotes a first transfer portion, which transfers charges in the charge holding portion 602 to the sense node 603 of the amplifying portion. Reference numeral 605 denotes a second transfer portion that is provided if necessary. The second transfer portion 605 transfers charges in the photoelectric conversion portion 601 to the charge holding portion 602. Reference numeral 608 denotes a reset portion, which supplies a reference voltage to at least an input portion of the amplifying portion. Furthermore, the reset portion 608 may supply a reference voltage to the charge holding portion 602. Reference numeral 607 denotes a selecting portion that is provided if necessary. The selecting portion 607 selectively outputs signals of respective pixel rows to a signal line. Reference numeral 606 denotes an amplifying portion. The amplifying portion 606 constitutes a source follower circuit together with a constant current source provided to the signal line. Reference numeral 609 denotes a charge output control portion, which controls the electrical connection between the photoelectric conversion portion 601 and a power supply line functioning as an overflow drain (hereinafter OFD).

Reference symbol RES denotes a wire for supplying a drive pulse to the reset portion 608. Reference symbol TX1 denotes a wire for supplying a drive pulse to the first transfer portion 604. Reference symbol TX2 denotes a wire for supplying a drive pulse to the second transfer portion 605. This wire can also serve as a wire for supplying a control pulse of the control electrode in the charge holding portion 602. Reference symbol SEL denotes a wire for supplying a drive pulse to the selecting portion 607.

The equivalent circuit is not limited thereto, and part of the configuration may be shared by a plurality of pixels. Also, the equivalent circuit is applicable to a configuration in which control wiring of individual elements is fixed to a constant voltage and in which control of conduction is not performed.

The second transfer portion 605 may have a buried channel MOS transistor configuration so that charges generated by the photoelectric conversion portion 601 immediately flow into the charge holding portion 602. In this configuration, there is a portion where a potential barrier is partially low at a position deeper than a surface even in a non-conduction state. In this case, the charge transfer portion can be brought into a state where a certain voltage is supplied without performing active control. That is, a fixed potential barrier may be provided instead of a function as a transfer portion.

According to such a configuration, most of signal charges generated through photoelectric conversion when light enters the photoelectric conversion portion 601 can be transferred to the charge holding portion 602 without being accumulated in the photoelectric conversion portion 601. Accordingly, a charge accumulation time can be made uniform in the photoelectric conversion portions 601 of all the pixels. Also, when the MOS transistor is in a non-conduction state, holes are accumulated on the surface of a channel, and the channel for transferring charges exists at a predetermined depth with respect to the surface. Thus, an influence of a dark current on the interface of an insulating film can be reduced.

From another point of view, during a period when signal charges are accumulated in the photoelectric conversion portion 601 and the charge holding portion 602, the potential of the charge path between the photoelectric conversion portion 601 and the charge holding portion 602 is lower than the potential of the charge path between the photoelectric conversion portion 601 and the OFD region. Here, the potential means the potential for signal charges.

Furthermore, from the viewpoint of drive, charges moved from the photoelectric conversion portion 601 to the charge holding portion 602 in one exposure period are held in the charge holding portion 602 and are used as an image signal. That is, after one exposure period in the photoelectric conversion portion 601 starts, a signal is read from the pixel without through a reset operation of the charge holding portion 602. Note that one exposure period is commonly determined in the individual photoelectric conversion portions 601 when an image of one frame is captured.

In such a configuration, global exposure can be performed relatively easily, but the charges in the photoelectric conversion portion 601 are discharged to the OFD region during transfer from the charge holding portion 602 to the FD region. Thus, images are intermittent. In a case where continuity of images is particularly necessary in such a configuration, continuous images can be obtained by performing row by row exposure. Both can be switched as necessary.

Furthermore, in a pixel configuration with a MOS transistor having a buried channel structure, charges can be transferred at a low voltage from the photoelectric conversion portion 601 to the charge holding portion 602, which is appropriate in terms of increasing charge transfer efficiency at a low voltage when the pixel configuration is combined with the embodiments of the present invention.

An embodiment of the present invention can be carried out also in a solid-state image pickup device in which a charge holding portion is provided in each pixel for increasing a dynamic range and in which charges are transferred from the charge holding portion to a sense node.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

101 Photoelectric conversion portion
102 Charge holding portion
103 Transfer portion
106 N-type semiconductor region
110 N-type semiconductor region
111 Beneath-holding-portion isolation layer
117 Pixel isolation layer
113 Transfer gate electrode
114 Floating diffusion

The invention claimed is:
1. A solid-state image pickup device including a plurality of pixels, each of the plurality of pixels comprising:
  a photoelectric conversion portion configured to generate charges in accordance with incident light;
  a charge holding portion including a first semiconductor region of a first conductivity type configured to hold the charges generated by the photoelectric conversion portion;
  a floating diffusion; and
  a transfer portion including a transfer gate electrode configured to transfer the charges of the first semiconductor region into the floating diffusion,
  wherein
  a second semiconductor region of a second conductivity type is disposed under the first semiconductor region of a first conductivity type and at a first depth,
  a third semiconductor region of the second conductivity type is disposed under the second semiconductor region of the second conductivity type and at a second depth deeper than the first depth, and
  in a cross-sectional view including the first, second and third semiconductor region,
    a first line perpendicular to a surface of the photoelectric conversion portion, the first line crossing and dividing the first semiconductor region of the first conductivity type, a second line perpendicular to the surface of the photoelectric conversion portion, the second line crossing and dividing the first semiconductor region of the first conductivity type, the second line being positioned between the photoelectric conversion portion and the first line in the cross-sectional view, a third line parallel to the surface of the photoelectric conversion portion, the third line crossing and dividing the second semiconductor region of the second conductivity type at the first depth, and a fourth line parallel to the surface of the photoelectric conversion portion, the fourth line crossing and dividing the third semiconductor region of the second conductivity type at the second depth are defined so that a first intersection between the first and third lines and a second intersection between the second and third lines are both included in the second semiconductor region of the second conductivity type, a third intersection between the first and fourth lines is included in the third semiconductor region of the second conductivity type, and a fourth intersection between the second and fourth lines is included in a fourth semiconductor region of the first conductivity type but not on a border of the fourth semiconductor region.

2. The solid-state image pickup device according to claim 1, wherein a part of the fourth semiconductor region of the first conductivity type is included in the photoelectric conversion portion, and the third line crosses the part of the fourth semiconductor region of the first conductivity type in the cross-sectional view.

3. The solid-state image pickup device according to claim 1, wherein the plurality of pixels include first and second pixels, the first semiconductor region of the first or second pixel is disposed between a first photoelectric conversion portion of the first pixel and a second photoelectric conversion portion of the second pixel, in the cross-sectional view, the second line is positioned between the first photoelectric conversion portion of the first pixel and the first line, in the cross-sectional view, a fifth line perpendicular to the surface of the photoelectric conversion portion, the fifth line crossing the first semiconductor region of the first conductivity type, the second semiconductor region of the second conductivity type and a fifth semiconductor region of the first conductivity type which is disposed under the second semiconductor region and part of which is disposed laterally to the third semiconductor region, the fifth line being positioned between the second photoelectric conversion portion of the second pixel and the first line in the cross-sectional view, is defined so that a fifth intersection between the fifth and third lines is included in the second semiconductor region of the second conductivity type, and a sixth intersection between the fifth and fourth lines is included in the fifth semiconductor region of the first conductivity type, a part of the fourth semiconductor region of the first conductivity type is included in the first photoelectric conversion portion, a part of the fifth semiconductor region of the first conductivity type is included in the second photoelectric conversion portion, and the third line crosses the part of the fourth semiconductor region of the first conductivity type and the part of the fifth semiconductor region of the first conductivity type in the cross-sectional view.

4. The solid-state image pickup device according to claim 1, wherein a second-conductivity-type impurity concentration of the second semiconductor region of the second conductivity type is higher than a second-conductivity-type impurity concentration of a region that is under the floating diffusion region and that is at the same depth as the second semiconductor region of the second conductivity type.

5. The solid-state image pickup device according to claim 1, wherein the plurality of pixels are disposed on a first-conductivity-type substrate, and a charge path between the photoelectric conversion portion and the charge holding portion has a buried channel structure.

6. The solid-state image pickup device according to claim 1, wherein a second-conductivity-type impurity concentration of the second semiconductor region of the second conductivity type is higher than a second-conductivity-type impurity concentration of the third semiconductor region of the second conductivity type.

7. The solid-state image pickup device according to claim 1, wherein the charge holding portion includes a control electrode disposed above the first semiconductor region of the first conductivity type via an insulating film and configured to control a potential on a surface side of the first semiconductor region of the first conductivity type.

8. The solid-state image pickup device according to claim 1, wherein the third semiconductor region of the second conductivity type includes a plurality of sub regions of the second conductivity type disposed at different depths.

* * * * *